United States Patent [19]
Andreycak et al.

[11] Patent Number: 6,150,714
[45] Date of Patent: Nov. 21, 2000

[54] CURRENT SENSE ELEMENT INCORPORATED INTO INTEGRATED CIRCUIT PACKAGE LEAD FRAME

[75] Inventors: William M. Andreycak, Bedford, N.H.; Robert Monroe, Ashland, Mass.; Chuck Payne; Larry Wofford, both of Cary, N.C.

[73] Assignee: Texas Instruments Incorporated, Dallas, Tex.

[21] Appl. No.: 09/157,284

[22] Filed: Sep. 18, 1998

Related U.S. Application Data

[60] Provisional application No. 60/059,530, Sep. 19, 1997.

[51] Int. Cl.$^7$ .................................................. H01L 23/48
[52] U.S. Cl. .......................................... 257/690; 257/536
[58] Field of Search ...................... 257/690, 536, 257/537, 538, 678, 701

[56] References Cited

U.S. PATENT DOCUMENTS

| | | | |
|---|---|---|---|
| 4,054,814 | 10/1977 | Fegley et al. | 315/71 |
| 4,217,544 | 8/1980 | Schmidt | 324/65 |
| 4,246,786 | 1/1981 | Wiemer et al. | 73/362 |
| 4,314,225 | 2/1982 | Tominaga et al. | 338/4 |
| 4,484,213 | 11/1984 | Franklin | 357/51 |
| 4,818,895 | 4/1989 | Kaufman | 307/303.1 |
| 4,914,357 | 4/1990 | Valley | 315/309 |
| 4,926,542 | 5/1990 | Bougger | 29/619 |
| 4,945,445 | 7/1990 | Schmerda et al. | 361/101 |
| 5,204,554 | 4/1993 | Ohannes et al. | 307/443 |
| 5,229,640 | 7/1993 | Pak | 257/666 |
| 5,267,379 | 12/1993 | Pak | 29/25.35 |
| 5,274,351 | 12/1993 | Lee | 338/221 |
| 5,300,917 | 4/1994 | Maue et al. | 338/49 |
| 5,534,788 | 7/1996 | Smith et al. | 324/771 |
| 5,767,664 | 7/1998 | Price | 323/907 |

FOREIGN PATENT DOCUMENTS

| | | | |
|---|---|---|---|
| 0184609 | 7/1985 | European Pat. Off. | G01R 1/20 |
| 73-44995 | 12/1973 | France | H01I 1/24 |
| 34 05 442 | 2/1986 | Germany | G01R 1/20 |

OTHER PUBLICATIONS

Krum Al., "Power Sense Resistors—Minimizing Value; Maximizing Resolution," Advanced Packing, Spring 1993.
Unitrode Intergrated Circuits., "High Efficiency Regulator Controller," Unitrode Data Sheet for UC1835.
Unitrode Intergrated Circuits., "High Speed PWM Controller," Unitrode Data Sheet for UC1823A.
Vance et al., "Post–package Trim Increases IC Reliability," EE Times, Sep. 8, 1997.
Vishay Intertechnology, Inc., "A Comprehensive Guide to Resistive Shunts and Current Sensors," Catalog CO191.

*Primary Examiner*—Sara Crane
*Attorney, Agent, or Firm*—W. Daniel Swayze, Jr.; Wade James Brady, III; Frederick J. Telecky, Jr.

[57] ABSTRACT

An electronic device includes a conductive member disposed within an insulative package. The conductive member is formed from a lead frame used to form the interconnection pins for the device. The conductive member includes an elongated, folded sense element portion having a known resistance. The sense element portion is disposed between two sets of conductive lead portions extending from the conductive member forming pins used to provide a current to the device for sensing. An integrated circuit disposed within the package includes a differential amplifier having differential inputs connected to bond pads on the integrated circuit. The bond pads are connected to spaced-apart tap points of the sense element via conductive bond wires, so that the combination of the sense element and the differential amplifier forms a trans-impedance amplifier. The gain of the differential amplifier is controlled to be proportional to the magnitude of a reference voltage generated by a bandgap voltage reference circuit. The reference voltage varies with temperature such that the overall gain of the trans-impedance amplifier is constant over temperature. The nominal gain of the differential amplifier is established by an on-chip resistance, which is trimmed using fuse-programmable trim cells that are programmed via operational package pins during a pre-operation trim procedure.

11 Claims, 3 Drawing Sheets

CURRENT SENSE ELEMENT INCORPORATED INTO INTEGRATED CIRCUIT PACKAGE LEAD FRAME

CROSS REFERENCE TO RELATED APPLICATIONS

This application claims priority to Provisional Application No. 60/059,530 filed Sep. 19, 1997 and titled "Integrated Circuit Package Lead Frame Sense Element".

STATEMENT REGARDING FEDERALLY SPONSORED RESEARCH OR DEVELOPMENT

Not Applicable

BACKGROUND OF THE INVENTION

The present invention is related to the field of electronic circuit components and component packaging, and more particularly to electronic circuits using high-current, low-resistance current sensing resistors.

There is widespread use of current sensing resistors in various types of electronic circuits. These high-power, low-resistance resistors are commonly placed in series with a source of high current, such as a power supply output. The current causes a voltage proportional to the current to appear across the current sensing resistor. This current-indicating voltage is commonly referred to as a current sense signal. The current sense signal can be used by control circuitry whose operation varies in response to output current level. For example, an over-current protection circuit within a power supply can monitor output current via the current sense signal. The protection circuit may act to inhibit the power supply output as the output current level rises, in order to counteract the rise in output current level and thus keep it below a safe limit.

Typical existing current sensing resistors have resistance values on the order of 10–100 milliohms. These devices dissipate considerable power in the form of heat when operated at typical operating currents. For example, a 10 milliohm resistor operated at 10 amperes dissipates approximately 1 watt of power in the form of heat.

It is common for many or all of the components that constitute the circuit using the current sense signal to be fabricated on a single integrated circuit. An example of such a circuit is a control circuit for controlling the switching of a power transistor connected in series with the current sensing resistor. The control circuit uses the current sense signal from the current sensing resistor for any of a variety of purposes, such as over-current protection which prevents excess current from flowing through the switching transistor. The current sensing resistor is commonly a discrete component apart from the integrated control circuit. This configuration avoids the problems of excessive power dissipation on the integrated circuit and excessively high current densities on the integrated circuit that may exceed the current-handling capacity of conventional metallization and bond wires.

However, the use of discrete current sensing resistors separated from their associated integrated control circuits has associated drawbacks. One drawback is cost. Generally speaking, the cost of an electronic circuit board increases as the number of different components on the board increases. Accordingly, it is generally desirable to integrate as many circuit elements as possible onto integrated circuits, so that the overall component count on a board can be reduced to minimize costs. Another drawback of using discrete sensing resistors is that circuit operation may be hampered by excessive inductance in the circuit board traces that interconnect the sensing resistor with the integrated circuit, and also by impedance mismatches between the integrated circuit and the resistor that occur over an operating temperature range. The problems of excessive inductance and impedance mismatches can be substantially eliminated when components exist on the same integrated circuit.

It would be desirable to achieve the performance benefits of integrating the current sensing resistor and its associated control circuit components on an integrated circuit while avoiding the problems of excessive power dissipation and excessive current densities on the integrated circuit.

BRIEF SUMMARY OF THE INVENTION

In accordance with one aspect of the present invention, an electronic device is disclosed which includes a conductive current-sensing element incorporated within an integrated circuit package. The sense element has very low resistance and therefore low power dissipation. The sense element is separate from the integrated circuit, so that the integrated circuit does not experience high current densities. The sense element is physically close to the integrated circuit so that undesirable inductance and impedance mismatches are minimized.

The disclosed electronic device includes an insulative package having conductive leads extending from it. One or more of the conductive leads are commonly connected and serve as sense element input leads, and one or more of the conductive leads are commonly connected and serve as sense element output leads. A conductive sense element having a known resistance between spaced-apart tap points is disposed in the package and connected between the sense element input and output leads. An integrated circuit is also disposed in the package. The integrated circuit includes one or more electronic components that are electrically connected to bond pads on the integrated circuit to receive signals from the sense element. In one embodiment the integrated circuit includes a differential amplifier whose differential inputs are connected to the bond pads. Each bond pad is electrically connected to a corresponding tap point of the sense element, for example via bond wires, to couple the signal appearing across the sense element to the electronic components on the integrated circuit.

In one embodiment, the sense element and conductive leads are respective portions of a single conductive member formed from a lead frame used during the manufacture of the device. In a further embodiment, the sense element is an elongated portion of the conductive member, and may be folded to increase its length and therefore its effective resistance. Alternatively, for higher-current applications the sense element may be shorter and wider, so that its resistance is reduced and its current-carrying capacity increased.

In accordance with another aspect of the present invention, an amplifier is disclosed whose gain varies with temperature in an equal-but-opposite manner to the way in which the resistance of a conductive sense element varies with temperature, i.e., the temperature coefficient of the sense element. When the variable-gain amplifier is used with a corresponding current sense element, the overall circuit forms a trans-impedance amplifier whose gain is fixed and substantially constant over an operating temperature range. The variable-gain amplifier thus can be used to compensate for the relatively high temperature coefficient of a metal sense element, such as a sense element formed from an integrated circuit lead frame as described above.

According to another aspect of the present invention, a trim circuit is disclosed that can be used to trim the values of components on an integrated circuit after the integrated circuit has been packaged. The trim circuit employs fuse-programmable cells that are controlled via signals appearing on operational package pins during a pre-operational trim procedure. The trim circuit can be used to trim out pre-packaging manufacturing tolerances of on-chip circuit components, tolerances that arise from the packaging process itself (e.g., heat-induced shifts in component values), as well as to compensate for tolerances of off-chip circuit elements used with the integrated circuit, such as the lead frame sense element described above.

Other aspects, features, and advantages of the present invention are disclosed in the detailed description which follows.

DETAILED DESCRIPTION OF THE INVENTION

Figure 1:
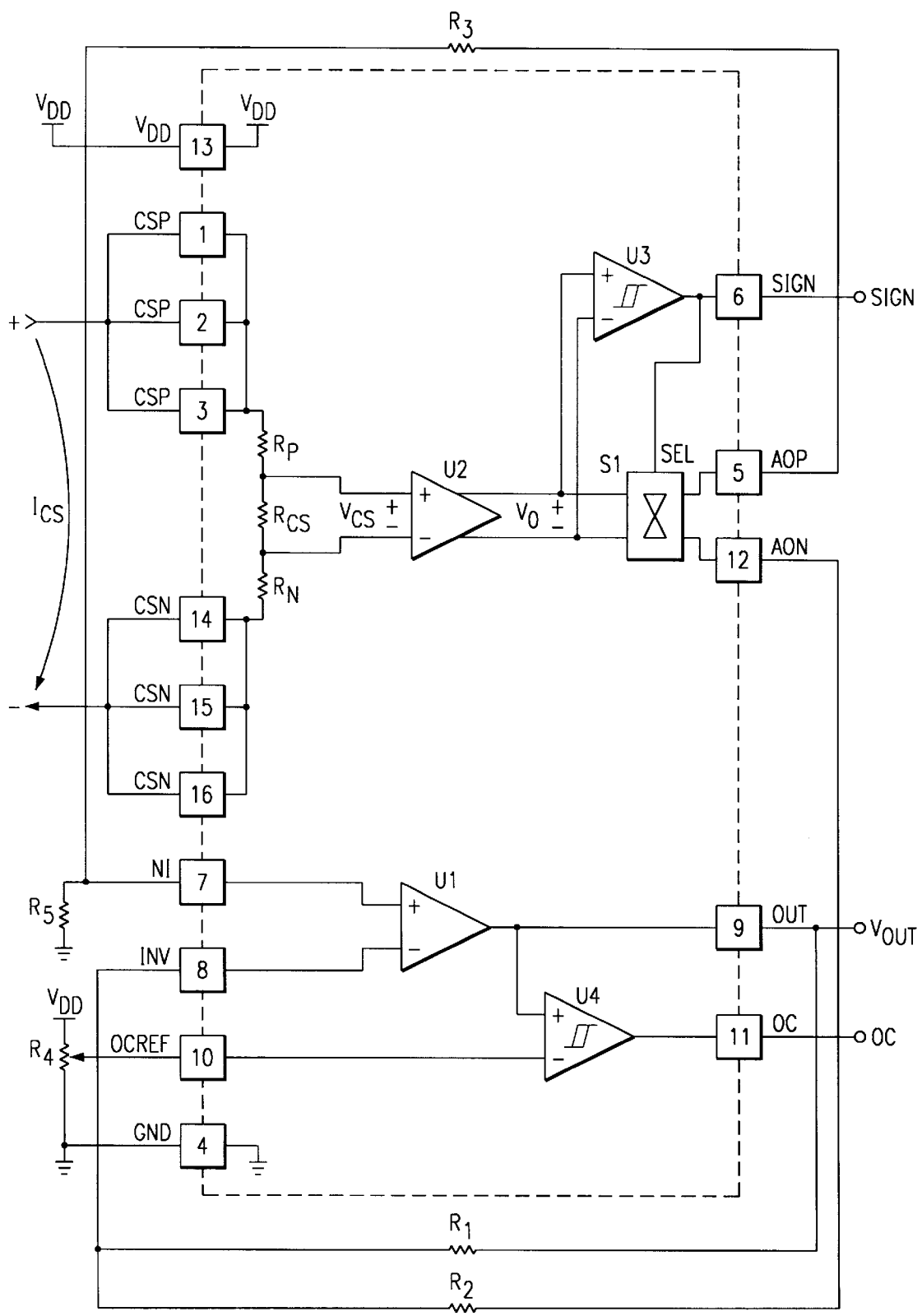
FIG. 1 is a schematic diagram of a sensor circuit employing an integrated circuit sensor device in accordance with the present invention.

FIG. 1 illustrates a current sense circuit employing an integrated circuit device 10 along with external resistors R1–R5. A variable resistor R4 is used to establish an over-current reference voltage OCREF, which is used in a manner described below. Resistors R1, R2, R3 and R5 are part of an amplifier stage including an amplifier U1 residing on the integrated circuit (IC) device 10. This amplifier stage is described in more detail below.

The IC device 10 has three commonly-connected pins labelled CSP, and three commonly-connected pins labelled CSN. Internally, a current-sensing resistor $R_{CS}$ having a very low 35 resistance is connected between the CSP and CSN pins. The resistances of the connections between the resistor $R_{CS}$ and the pins CSP, CSN are non-negligible, and are modelled in the illustrated embodiment as resistors $R_P$ and $R_N$. The total resistance between the CSP and CSN pins is approximately 1.3 milliohms, while the resistance of the resistor $R_{CS}$ itself is approximately 667 micro-ohms. When a current $I_{CS}$ flows through the current-sensing resistor $R_{CS}$ via the CSP and CSN pins, a voltage $V_{CS}$ is established at the differential inputs to an amplifier U2. The current $I_{CS}$ may be in the range from 1 to 20 amperes. The combination of the resistor $R_{CS}$ and the amplifier U2 form a trans-impedance amplifier that generates an output voltage $V_O$ as a predetermined function of the current $I_{CS}$ In the illustrated embodiment, this function is a fixed gain on the order of 33 millivolts per ampere.

As described in greater detail below, the current-sensing resistor $R_{CS}$ is a metal resistor contained within an insulative package in which the IC device 10 is mounted. The resistor $R_{CS}$ is part of a metal lead frame used to provide pins for the IC device 10 during its manufacture. As such, the resistor $R_{CS}$ has a considerably large positive temperature coefficient, which can cause substantial variation in the trans-impedance gain $V_O/I_{CS}$ over a normal operating temperature range. Thus as described below the amplifier U2 contains circuitry that alters the voltage gain $V_O/V_{CS}$ in a manner that compensates for the effects of the temperature coefficient of the resistor $R_{CS}$, so that the trans-impedance gain $V_O/I_{CS}$ is maintained substantially constant over the operating temperature range of the current sensing device.

The output voltage $V_O$ is supplied to a sign comparator U3 and a cross switch S1, which are useful in the event that the uni-polar IC 10 is used with currents that may be bi-polar. The sign comparator U3 outputs a binary signal SIGN indicative of the polarity of the voltage $V_O$. This signal is provided to a package pin to enable its use by external circuitry (not shown in FIG. 1). The signal SIGN is also provided to the cross switch S1. When the signal SIGN is asserted, indicating that the voltage $V_O$ is positive, the positive output from U2 is provided to the package pin AOP and the negative output from U2 is provided to the package pin AON. When the signal SIGN is de-asserted, indicating that the voltage $V_O$ is negative, the positive output from U2 is provided to the package pin AON and the negative output from U2 is provided to the package pin AOP. Thus the voltage between the pins AOP and AON is equal to the absolute value or magnitude of the voltage $V_O$, and thus is proportional to the magnitude of the current $I_{CS}$.

The signals AOP and AON are provided to the amplifier circuit formed from amplifier U1 and resistors R1, R2, R3 and R5. This amplifier circuit performs three functions in the circuit of FIG. 1. The amplifier circuit converts the differential voltage between AOP and AON into a single-ended output signal OUT that can be readily used by external circuitry not shown in FIG. 1. Also, the circuit provides a voltage gain that is programmable via the selection of the resistors R1, R2 and R3. By proper selection of these resistors, the overall trans-impedance gain $V_{OUT/ICS}$ can be set to a value that is appropriate for specific uses of the sensing circuitry. Thus for example if the maximum value of the current $I_{CS}$ is relatively low in a particular application, it may be desirable to program the U1-based amplifier to have higher gain than it would have in a higher-current application. The amplifier circuit also provides a DC zero reference on $V_{out}$ as established by the resistor R5. In the illustrated embodiment, this reference is zero volts, because R5 is connected to ground. In alternative embodiments, R5 can be connected to other reference potentials in order to obtain a desired DC zero reference on $V_{out}$.

The IC device 10 also contains an over-current comparator U4. The comparator U4 generates a binary signal OC that is asserted when the value of the signal OUT is greater than the over-current threshold signal OCREF. In the illustrated embodiment, the value of the signal OCREF is established by the variable resistor R4; it may be established in any of a variety of known ways in alternative embodiments. The signal OC can be used by external protection circuitry not shown in FIG. 1.

Figure 2:
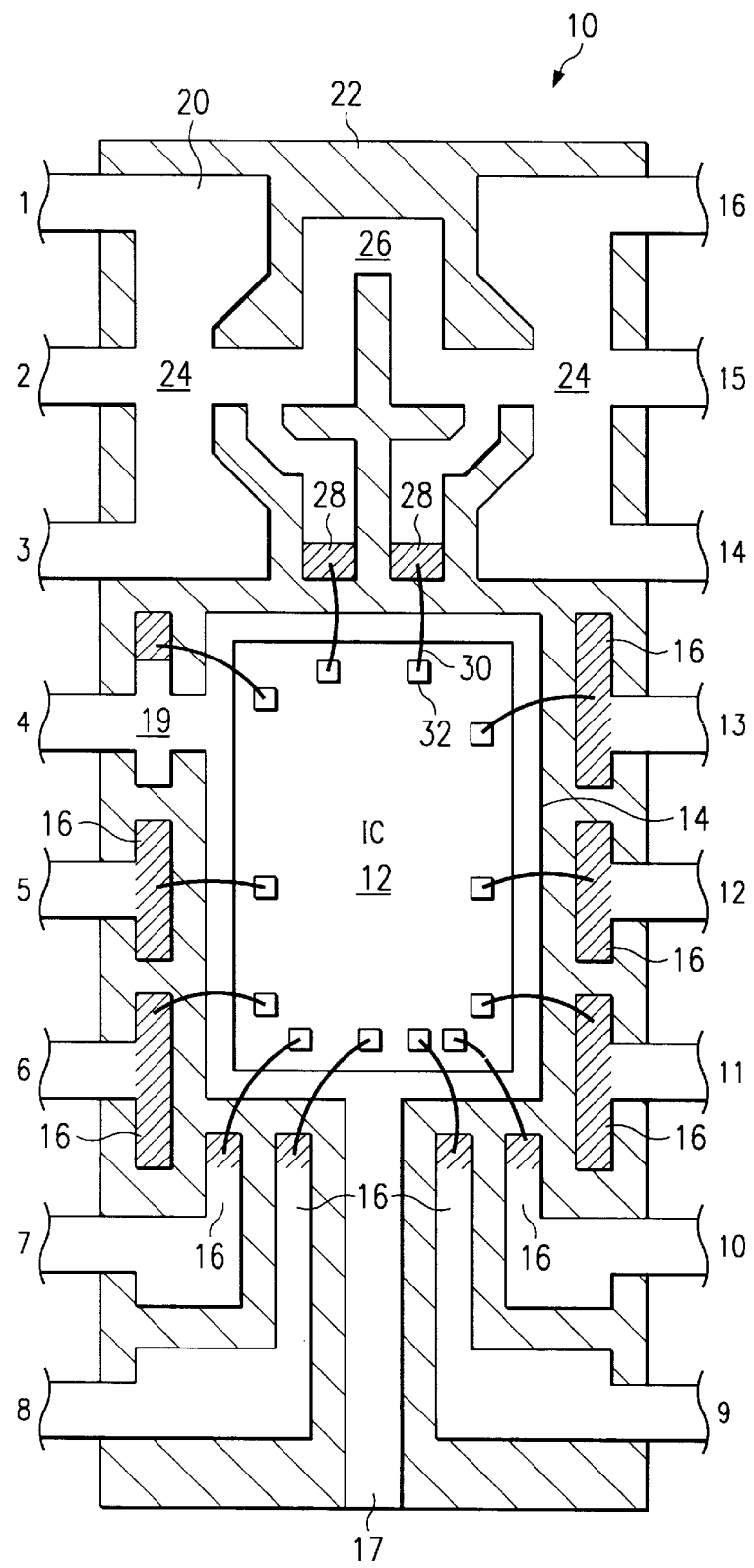
FIG. 2 is a plan diagram of the physical layout of the integrated circuit sensor device of FIG. 1.

FIG. 2 shows a schematic representation of the physical construction of the IC device 10. A silicon IC 12 contains the active circuit components U1–U4 and S1 of FIG. 1. The IC device 10 contains 16 metal leads or pins with inwardly-extending metal traces terminating in bonding contacts 16. The IC 12 is secured to a rectangular metal paddle 14. A metal tie bar 17 supports the paddle 14 at one end, and at the other end the paddle 14 is joined by trace 19 to pin 4 of the device 10. A metallic grid-like member 20 is shown extending across the top of the device 10 between pins 1, 2 and 3 on the left and pins 14, 15 and 16 on the right. The paddle 14, contacts 16, tie bar 17, trace 19 and member 20 are encapsulated within a plastic package, the bottom half of which is shown in section in FIG. 2 and indicated by reference number 22.

The tie bar 17 and trace 19 help to stabilize the paddle 14 during assembly of the device 10. While it is common for plastic-encapsulated IC devices to have paddles supported by tie bars at both the upper and lower ends, this configuration is not feasible in the device 10 due to the presence of the metallic member 20 across the top. The connection to trace 19, therefore, is in lieu of an upper tie bar. It may be possible in alternative embodiments to dispense with the trace 19 if the support provided is deemed unnecessary. Alternatively, it may be desirable to support the paddle using a trace to another pin, or to use traces to multiple pins.

The member 20 contains two mixing areas 24 used to funnel current between a sense element portion 26 and the sets of pins (1, 2, 3) and (14, 15, 16) respectively. Two spaced-apart tap points 28 are disposed at opposite ends of the sense element portion 26. As shown, the tap points 28 as well as the bonding contacts 16 are connected to corresponding bond pads 32 on the IC 12 via bond wires 30.

The sense element portion 26 of the member 20 serves as the current sense resistor $R_{CS}$ of FIG. 1. The member 20 and sense element portion 26 are made so that the desired resistance and current-carrying capacity for the current sense resistor $R_{CS}$ are obtained within the confines of the package 22. In the illustrated embodiment, the member 20 is made of the following alloy, which is ¾ hard and yields an electrical conductivity of 95% IACS at 20 C.:

Cu—99.9%, Zr—0.1%

The thickness of the member 20 is chosen to yield a desired sheet resistance while retaining sufficient mechanical strength. The width and length of the sense element portion 26 are chosen to yield the desired resistance $R_{CS}$ and the ability to handle the expected range of operating currents $I_{CS}$ As shown, in the illustrated embodiment the sense element portion 26 is folded into the shape of an inverted "U" to obtain the desired length. Any of a variety of geometries may be employed to achieve a desired mixture of overall resistance and current-carrying capacity. For example, for applications in which the maximum value of $I_{CS}$ is above 100 amperes, it may be preferable for the sense element portion 26 to be straight, short, and wide, so that its resistance is decreased and its current-carrying capacity increased relative to the sense element portion 26 shown in FIG. 2. Also, it may be desirable in alternative embodiments to use different sets of package pins to connect to the sense element portion 26, including sets residing on the same side of the package 22.

It will be appreciated that the illustrated configuration in which the current sense resistor $R_{CS}$ is incorporated into the leadframe of the IC 10 yields several advantages: (1) Very low values of sense resistance can be established, minimizing the effect on external circuitry; (2) The sensing circuitry is relatively non-inductive; (3) The sensing circuitry can be used to sense relatively large currents; (4) Power dissipation is relatively low; and (5) Thermal coupling between the sense element portion 26 and the package pins 1, 2, 3, 14, 15, and 16 is excellent, so that heat conduction away from the device 10 is enhanced.

Due to its construction from a metallic lead frame, the sense element portion 26 has a very high temperature coefficient, on the order of −3350 ppm/° C. That is, the resistance $R_{CS}$ increases by a factor of about 0.003 when the temperature rises by 1° C. The substantial variation in the value of $R_{CS}$ makes it difficult to specify the transimpedance gain $V_{OUT}/I_{CS}$ with adequate precision. However, during operation the sense element 26 tends to heat the plastic package 22, which in turn heats the IC 12, so that the temperature of the IC 12 is closely matched to the temperature of the sense element 26. This matching is exploited in a manner described below to provide temperature compensation so that the gain $V_{OUT}/I_{CS}$ remains substantially constant over operating temperature.

Figure 3:
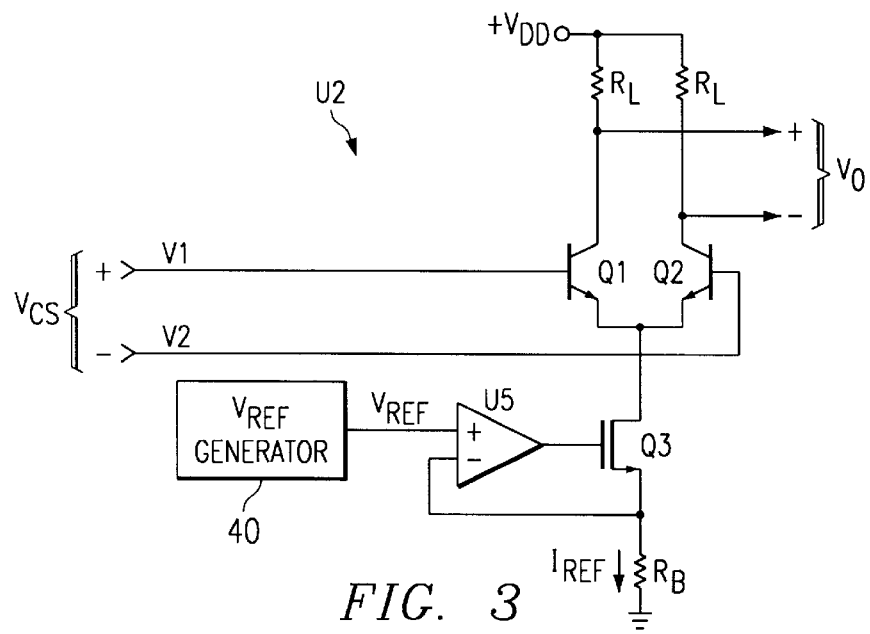
FIG. 3 is a schematic diagram of a current sense amplifier circuit in the integrated circuit sensor device of FIG. 1.

FIG. 3 shows the configuration of the amplifier U2 of FIG. 1. The input signal $V_{CS}$ is supplied to a differential transistor pair Q1 and Q2. Load resistors RL are used to develop the output signal $V_O$, and a resistor RB is used to establish bias for Q1 and Q2. The gain of the amplifier is controlled by circuitry including a voltage reference (VREF) generator 40, differential amplifier U5, and transistor Q3. It can be shown that value of the transimpedance gain $V_{OUT}/I_{CS}$ using the amplifier of FIG. 3 is as follows:

$$V_{OUT}/I_{CS} = -(RL/RB)*(VREF*R_{CS})/V_T$$

where VT is the thermal voltage of silicon, or kT/q. The temperature coefficients of the resistors RL and RB are equal, and thus cancel each other. As previously mentioned, the temperature coefficient for $R_{CS}$ is approximately −3350 ppm/° C. The temperature coefficient for $V_T$ is approximately −3333 ppm/° C. The temperature coefficient for VREF is set in order to minimize the overall temperature coefficient for the term $(VREF*R_{CS})/V_T$, so that the overall temperature coefficient for the gain $V_{OUT}/I_{CS}$ is therefore minimized. The VREF generator 40 is thus designed so that the voltage VREF has the desired temperature coefficient. This temperature compensation can be accomplished using a bandgap reference and techniques described in U.S. Pat. No. 5,767,664 to Burt L. Price, assigned to Unitrode Corporation and entitled "Bandgap Voltage Reference Based Temperature Compensation Circuit".

The nominal value of VREF and the ratio RL/RB in the above equation can be established fairly precisely, despite normal variations in circuit characteristics among different ICs 10 that are caused by variations in the IC manufacturing process. However, the resistance $R_{CS}$ is subject to substantial variation, and thus the absolute value of the temperature-independent gain $V_O/I_{CS}$ can vary substantially among different ICSs 10. To enable more precise specification of the gain $V_O/I_{CS}$ taking into account manufacturing process variations, an in-package trimming technique is employed to vary the resistance of the resistor RB such that the ratio $R_{CS}/RB$ can also be controlled with desired precision. This technique is described below with reference to FIGS. 4 and 5.

Figure 4:
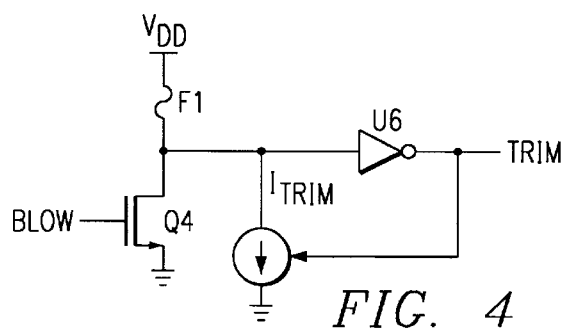
FIG. 4 is a schematic diagram of a fuse-programmable circuit having a binary output used in the integrated circuit sensor device of FIG. 1.

FIG. 4 shows a circuit used to set a binary value TRIM that can be used, for example, to trim the resistance of the resistor RB to achieve the desired overall gain $V_O/I_{CS}$. When a fuse F1 is intact, the input to an inverter U6 is maintained at a logic HIGH, causing the signal TRIM to be de-asserted. A low-valued current source $I_{TRIM}$ is turned OFF. If it is desired for the signal TRIM to be asserted, a signal BLOW is asserted, which causes sufficient current to be conducted through a transistor Q4 that the fuse F1 opens. The current source $I_{TRIM}$ then pulls the input to the inverter U6 low, causing the signal TRIM to be asserted. It should be noted that the current source $I_{TRIM}$ conducts a very small current even in the OFF state, to enable proper powering up of the circuit when the fuse F1 is blown. The signal TRIM is typically used to control switches used to adjust the value of a circuit parameter. For example, a switch can be used to connect a trim resistor in parallel with a resistor such as RB to reduce the effective resistance appearing between the resistor's terminals.

Figure 5:
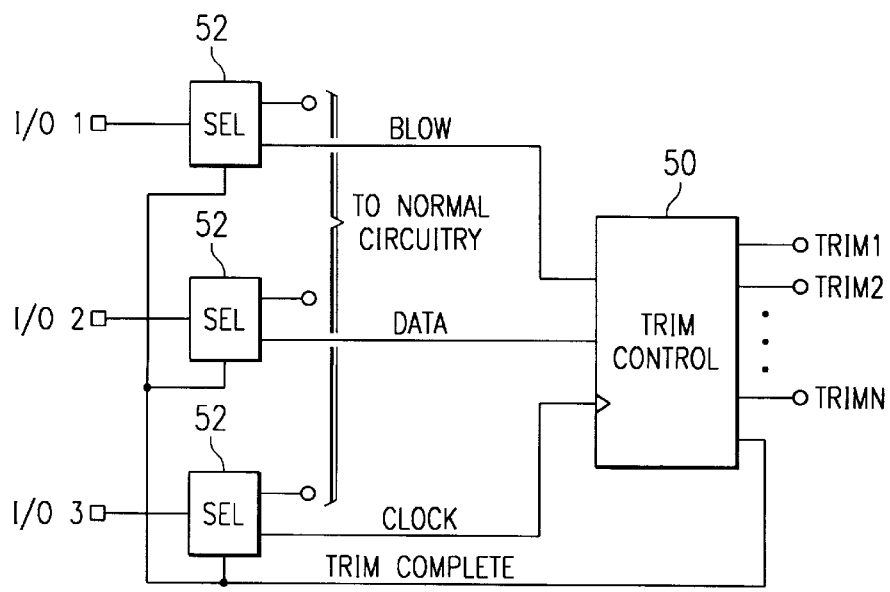
FIG. 5 is a schematic diagram of a programmable post-packaging trim circuit in the integrated circuit sensor device of FIG. 1 employing the fuse-programmable circuit of FIG. 4.

The circuit of FIG. 4 is used as part of the post-packaging trimming circuitry shown in FIG. 5. Specifically, a number of such circuits are used within a serially-accessed trim controller 50. The trim controller 50 provides a number of fuse-programmable trim control signals TRIM1–TRIMN that can be used as described above to trim circuit parameters. For example, one or more of the outputs TRIMx are used to adjust the value of the resistance RB. The trim controller 50 also generates a fuse-programmable signal TRIM COMPLETE, which is de-asserted until its corresponding fuse is blown. The signal TRIM COMPLETE is provided to a set of selectors 52 that enable IC pins used for normal operation to also control the trim operation. The selectors 52 cause the pins to be connected to the trim controller 50 when the signal TRIM COMPLETE is de-asserted, and to otherwise be connected normally to operational circuitry.

The circuit of FIG. 5 is used as follows. The signal TRIM COMPLETE is initially de-asserted, because its fuse is intact. The signals CLOCK and DATA are asserted via the I/O pins to select a desired TRIMx output, and then the signal BLOW is asserted to cause the fuse in the selected cell to open. As a result, the selected TRIMx signal becomes asserted. When all of the desired TRIMx signals have been programmed, the TRIM COMPLETE cell is then selected via CLOCK and DATA, and BLOW is asserted to open the fuse. As a result, the signal TRIM COMPLETE becomes asserted, causing the selectors 52 to disconnect the I/O pins from the trim controller 52 and connect them to their normal operational circuitry.

The foregoing has described several aspects of an embodiment of a current sensing IC device. It will be apparent to those skilled in the art that modification to and variation of the above-described methods and apparatus are possible without departing from the inventive concepts disclosed herein. Accordingly, the invention should be viewed as limited solely by the scope and spirit of the appended claims.

What is claimed is:

1. An electronic device, comprising:
   an insulative package having a plurality of conductive leads extending therefrom, one or more of the conductive leads being commonly connected and serving as sense element input leads, and one or more of the conductive leads being commonly connected and serving as sense element output leads;
   a conductive sense element disposed within the package, the conductive sense element being connected between the sense element input and output leads, the conductive sense element having a known resistance between first and second spaced-apart tap points disposed thereon; and
   an integrated circuit disposed within the package, the integrated circuit including first and second bond pads and a differential amplifier having differential inputs connected respectively to the bond pads, each bond pad being electrically connected to a corresponding tap point of the sense element, the differential amplifier being operative to generate an output voltage substantially proportional to the magnitude of the current flowing through the sense element over an operating temperature range of the device.

2. An electronic device according to claim 1, wherein the conductive sense element and the sense element input and output leads are respective portions of a single conductive member.

3. An electronic device according to claim 2, wherein the conductive sense element comprises an elongated folded strip portion of the conductive member.

4. An electronic device according to claim 2, wherein the input and output leads are on opposite side of the single conductive member with the sense element portion extending therebetween.

5. An electronic device according to claim 4, wherein the conductive sense element portion comprises an elongated folded strip portion of the conductive member.

6. An electronic device according to claim 5, wherein the elongated folded strip portion is substantially U-shaped.

7. An electronic device according to claim 1, wherein the bond pads on the integrated circuit are connected to the tap points of the sense element via conductive bond wires.

8. An electronic device according to claim 1, wherein the sense element has a temperature coefficient on the order of −3350 ppm/° C.

9. An electronic device, comprising:
   an insulative package;
   a conductive member disposed within the package, the conductive member including a sense element portion disposed between a first plurality of conductive lead portions extending from the conductive member and a second plurality of conductive lead portions extending from the conductive member, the conductive lead portions forming external interconnection pins of the electronic device, the conductive sense element portion having a known resistance between first and second spaced-apart tap points located thereon;
   an integrated circuit disposed within the package, the integrated circuit having a differential amplifier formed thereon having differential inputs connected to first and second bond pads on the integrated circuit, each bond pad being connected to a corresponding tap point of the sense element via a conductive bond wire, the differential amplifier having a gain proportional to the magnitude of a reference voltage supplied thereto; and
   a reference voltage generator circuit operative to generate the reference voltage such that the product of the differential amplifier gain and the resistance between the tap points of the sense element portion of the conductive member over the operating temperature range is substantially constant.

10. A device according to claim 9, wherein the differential amplifier comprises a resistor having a resistance to which the gain of the differential amplifier is proportional, and further comprising a trim circuit connected between the resistor and a set of external pins of the electronic device, the trim circuit being operative to trim the resistance of the resistor in response to trim control signals supplied to the set of external device pins.

11. A device according to claim 10, wherein the trim circuit contains one or more fuse-programmable cells having binary outputs used to trim the resistance of the resistor, the fuses of the fuse-programmable cells being opened in response to the trim control signals.

* * * * *